US008850155B2

(12) United States Patent
Brandl et al.

(10) Patent No.: US 8,850,155 B2
(45) Date of Patent: Sep. 30, 2014

(54) DDR 2D VREF TRAINING

(75) Inventors: Kevin M. Brandl, Austin, TX (US);
Oswin E. Housty, Austin, TX (US);
Gerald Talbot, Concord, MA (US)

(73) Assignee: Advanced Micro Devices, Inc., Austin, TX (US)

( * ) Notice: Subject to any disclaimer, the term of this patent is extended or adjusted under 35 U.S.C. 154(b) by 453 days.

(21) Appl. No.: 13/330,460

(22) Filed: Dec. 19, 2011

(65) Prior Publication Data

US 2013/0155788 A1 Jun. 20, 2013

(51) Int. Cl.
*G06F 13/00* (2006.01)

(52) U.S. Cl.
USPC ............................. 711/170; 711/154; 711/167

(58) Field of Classification Search
USPC ......................................... 711/154, 167, 170
See application file for complete search history.

(56) References Cited

U.S. PATENT DOCUMENTS

| 7,111,108 | B2 * | 9/2006 | Grundy et al. | 711/100 |
|---|---|---|---|---|
| 7,991,098 | B2 | 8/2011 | Hollis | |
| 8,390,352 | B2 * | 3/2013 | Seefeldt et al. | 327/161 |
| 2008/0197877 | A1 * | 8/2008 | Cox et al. | 326/38 |
| 2010/0162037 | A1 * | 6/2010 | Maule et al. | 714/5 |
| 2010/0174955 | A1 * | 7/2010 | Carnevale et al. | 714/718 |

* cited by examiner

*Primary Examiner* — Reba I Elmore
(74) *Attorney, Agent, or Firm* — Williams Morgan, P.C.

(57) ABSTRACT

A method is provided for performing memory operations in response to instructions to perform a double data rate (DDR) memory reference voltage training in the voltage domain by a processing device and determining a DDR memory reference voltage and a DDR memory delay time based upon the memory operation. Computer readable storage media are also provided. A circuit is provided that includes a communication interface portion coupled to a memory and to a processing device. The circuit also includes a circuit portion, coupled to the communication interface portion that has a hardware state machine or an algorithm. The state machine or algorithm provides instructions to the processing device to perform a double data rate (DDR) reference voltage training in the voltage domain.

23 Claims, 6 Drawing Sheets

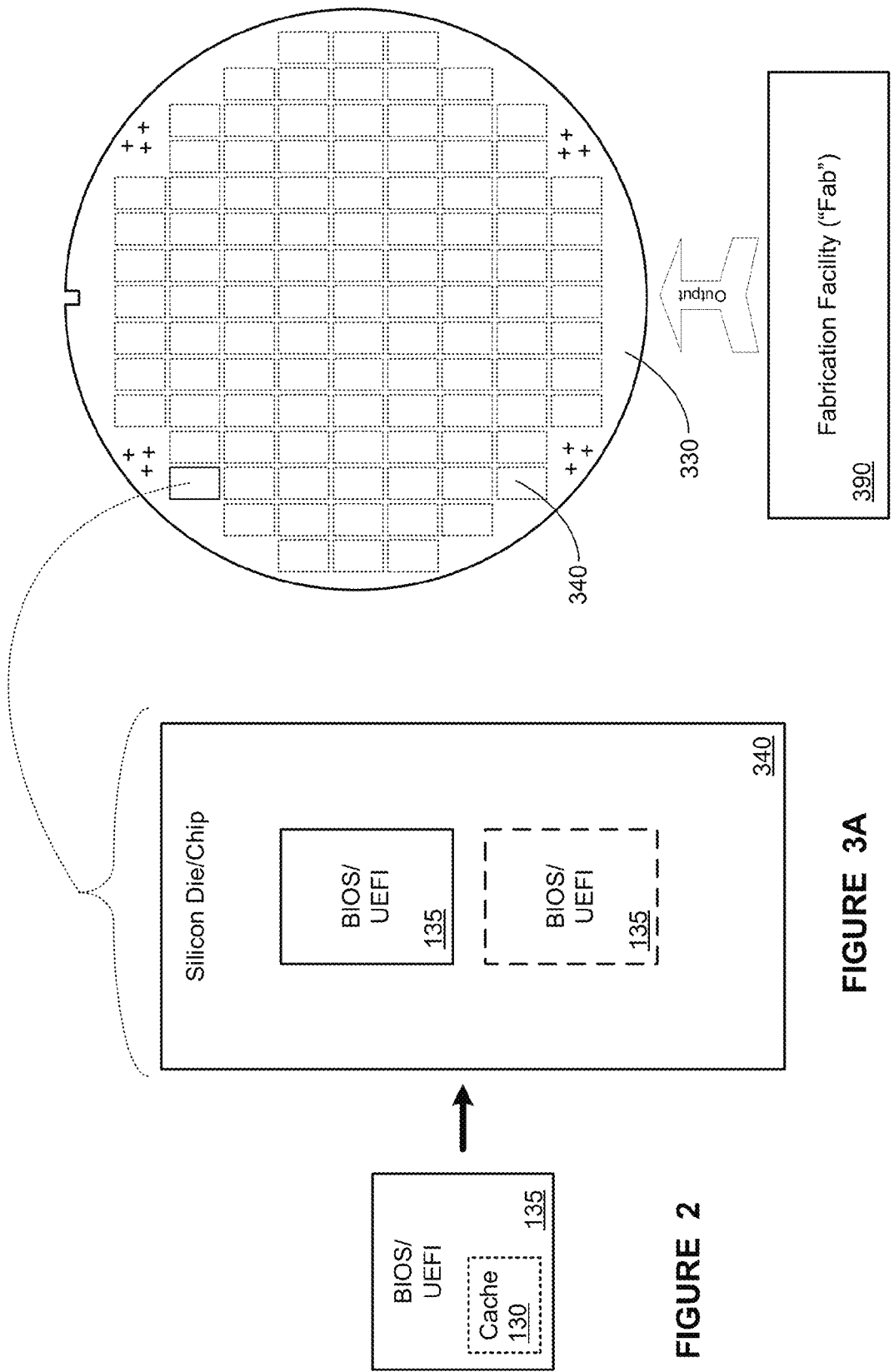

DDR 2D VREF TRAINING

BACKGROUND

1. Field of the Invention

Embodiments presented herein relate generally to computing systems, and, more particularly, to a method for two-dimensional (2D) training for double data rate (DDR) memory data eye training using reference voltages (Vrefs) and signal timing.

2. Description of Related Art

Electrical circuits and devices that execute instructions and process data have evolved becoming faster, larger and more complex. With the increased speed, size, and complexity of electrical circuits and data processors, data eye training has become more problematic, particularly in DDR memory systems. As technologies for electrical circuits and processing devices have progressed, there has developed a greater need for efficiency, reliability and stability, particularly in the area of DDR memory data eye training. However, considerations for algorithm processing, overall system boot-up performance, as well as system complexity introduce substantial barriers to efficiently training data eyes in DDR memory systems. The areas of acceptable data eye formation, Vref tolerances (e.g., voltage margins) and data transfer speeds are particularly problematic, for example, in systems that utilize and/or support different types of interchangeable microprocessors or DDR RAM.

Typically, modern implementations for data eye training in DDR systems, as noted above, have taken the approach of solving data eye training in the time domain, limited to a nominal Vref value setting. However, this approach has undesirable drawbacks. For example, time domain training does not allow for Vref tolerances to be adequately met or utilized, nor does time domain training allow for adequate system boot reliability across a variety of hardware platforms.

Embodiments presented herein eliminate or alleviate the problems inherent in the state of the art described above.

SUMMARY OF EMBODIMENTS

In one aspect of the present invention, a method is provided. The method includes performing memory operations in response to instructions to performing a double data rate (DDR) memory reference voltage training in the voltage domain by a processing device. The method also includes determining a DDR memory reference voltage and a DDR memory delay time based at least upon the performed at least one memory operation.

In another aspect of the invention, a non-transitory, computer-readable storage device encoded with data that, when executed by a processing device, adapts the processing device to perform a method, is provided. The method includes performing memory operations in response to instructions to performing a double data rate (DDR) memory reference voltage training in the voltage domain by a processing device. The method also includes determining a DDR memory reference voltage and a DDR memory delay time based at least upon the performed at least one memory operation.

In yet another aspect of the invention, a circuit is provided. The circuit includes at least one communication interface portion communicatively coupled to at least one memory portion and to a processing device. The circuit also includes a circuit portion, communicatively coupled to the at least one communication interface portion, that comprises at least one of a hardware state machine, or an algorithm, adapted to provide instructions to the processing device to perform a double data rate (DDR) reference voltage training at least in the voltage domain.

BRIEF DESCRIPTION OF THE DRAWINGS

The embodiments herein may be understood by reference to the following description taken in conjunction with the accompanying drawings, in which the leftmost significant digit(s) in the reference numerals denote(s) the first figure in which the respective reference numerals appear, and in which:

FIG. 2 shows a simplified block diagram of a BIOS/UEFI that includes a cache, according to one embodiment;

FIG. 3A provides a representation of a silicon die/chip that includes one or more BIOS/UFEI, according to one embodiment;

FIG. 3B provides a representation of a silicon wafer which includes one or more die/chips that may be produced in a fabrication facility, according to one embodiment;

Figure 1:
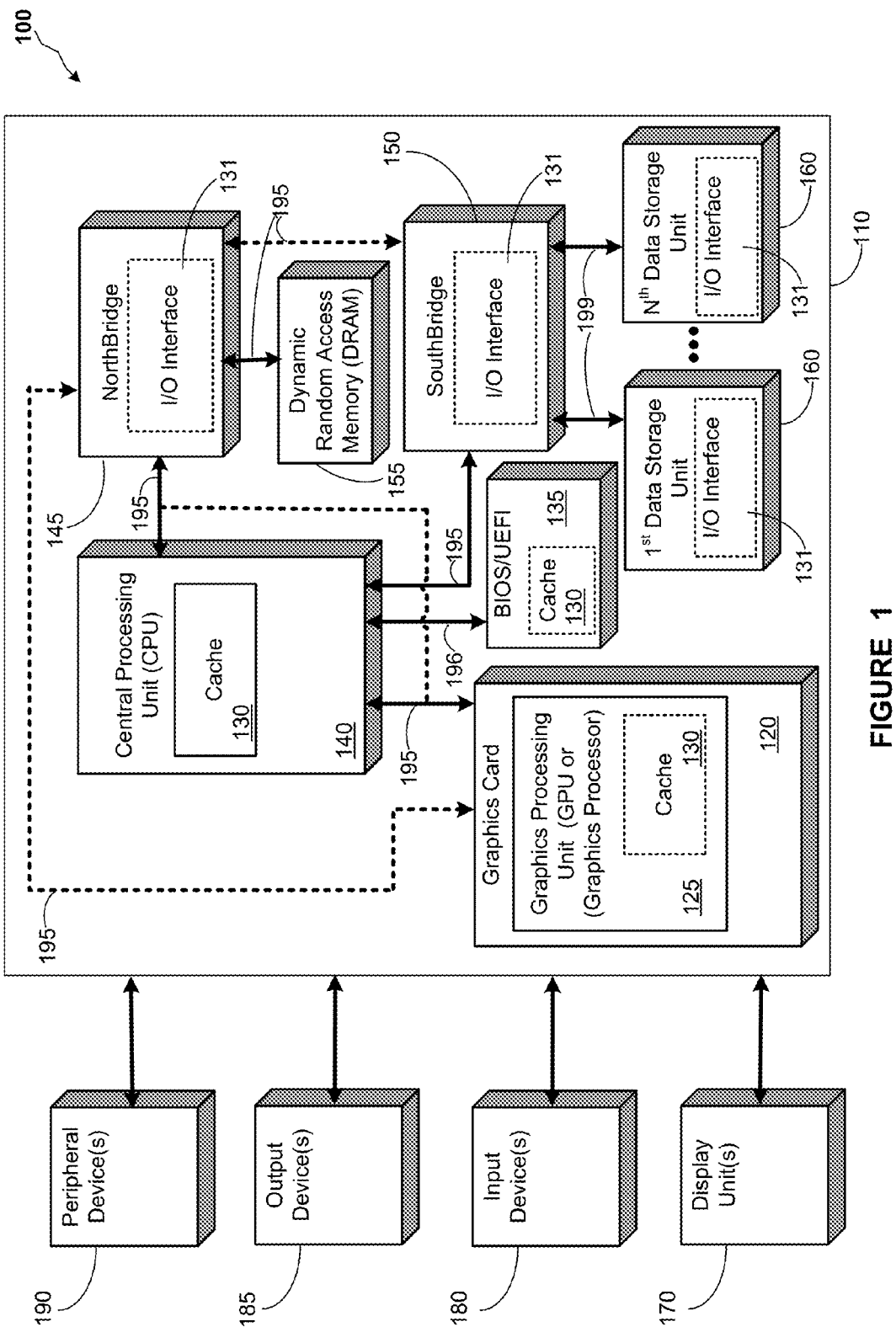
FIG. 1 schematically illustrates a simplified block diagram of a computer system, according to one embodiment.

While the embodiments herein are susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the scope of the invention as defined by the appended claims.

DETAILED DESCRIPTION

Illustrative embodiments of the instant application are described below. In the interest of clarity, not all features of an actual implementation are described in this specification. It will of course be appreciated that in the development of any such actual embodiment, numerous implementation-specific decisions may be made to achieve the developers' specific goals, such as compliance with system-related and/or business-related constraints, which may vary from one implementation to another. Moreover, it will be appreciated that such a development effort might be complex and time-consuming, but may nevertheless be a routine undertaking for those of ordinary skill in the art having the benefit of this disclosure.

Embodiments of the present application will now be described with reference to the attached figures. Various structures, connections, systems and devices are schematically depicted in the drawings for purposes of explanation only and so as to not obscure the disclosed subject matter with details that are well known to those skilled in the art. Nevertheless, the attached drawings are included to describe and explain illustrative examples of the present embodiments. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As used herein, the terms "substantially" and "approximately" may mean within 85%, 90%, 95%, 98% and/or 99%. In some cases, as would be understood by a person of ordinary skill in the art, the terms "substantially" and "approximately" may indicate that differences, while perceptible, may be negligent or be small enough to be ignored. Additionally, the term "approximately," when used in the context of one value being approximately equal to another, may mean that the values are "about" equal to each other. For example, when measured, the values may be close enough to be determined as equal by one of ordinary skill in the art.

As used herein, the suffixes "#", "_b" and "_n" (or "b" and "n") denote a signal that is active-low (i.e., the signal is activated or enabled when a logical '0' is applied to the signal). Signals not having these suffixes may be active-high (i.e., the signal is activated or enabled when a logical '1' is applied to the signal). While various embodiments and Figures herein are described in terms active-high and active-low signals, it is noted that such descriptions are for illustrative purposes of various embodiments and that alternate configurations are contemplated in other embodiments not explicitly described in this disclosure.

Embodiments presented herein relate to reference voltage (Vref) training in DDR memories. DDR memory Vref training may be performed at system boot (e.g., when booting a computer such as computer system 100, described below) by a basic input/output system (BIOS), a unified extensible firmware interface (UEFI) and/or the like. Vref training may be used to place a memory data strobe within the data eye for a given memory cycle. Vref training may also be used to adjust an operating Vref for the DDR memory. That is, Vref training, as described herein, may be performed by way of a two-dimensional analysis in the time and voltage domains. By performing such a two-dimensional analysis, it may be possible to adjust and/or select the operating Vref(s) for a DDR memory by making tradeoffs between optimized timing and Vref voltage margins. It is noted that the Vref training may occur on a byte lane by byte lane basis, on a rank by rank basis, on a channel by channel basis, or across all byte lanes, in various embodiments. It is also noted that while the embodiments described herein may be referred to in terms of memory cycles, read cycles and/or write cycles, the described embodiments are not thus limited and may be applied to read and write cycles equally.

DDR memory training may be accomplished on a per channel, per rank, and/or per lane basis. In alternate embodiments, other groupings of data (e.g., per bit) may be used. As an example, for each rank pair on a dual-rank or quad-rank dual inline memory module (DIMM), the BIOS/UEFI may use the per-lane mutual passing delay values of each rank to calculate the optimal delay values. The BIOS/UEFI may use the mutual passing voltage values across all ranks and all lanes of the channel to calculate the desired Vref setting.

DDR memory training may involve interactions among all the populated channels of a processor. The channel currently being trained will be called the victim channel herein, and all other channels will be called aggressor channels for purposes of this description. Read training, or training of memory read cycles, may take place after timing delays for write data and write data strobe signals have been determined for all channels/lanes. Similarly, write training, or training of memory write cycles, may take place after timing delays for read data and read data strobe signals have been determined for all channels/lanes. In some embodiments, the DDR memory training may be an iterative process. For example, if read cycles have been previously trained, and write cycles are subsequently trained, the write cycle training may effect the bus signaling such that the read cycles may require additional training. In one embodiment, write cycle training may be performed before read cycle training.

Turning now to FIG. 1, a block diagram of an exemplary computer system 100, in accordance with an embodiment of the present application, is illustrated. In various embodiments the computer system 100 may be a personal computer, a laptop computer, a handheld computer, a tablet computer, a mobile device, a telephone, a personal data assistant ("PDA"), a server, a mainframe, a work terminal, a music player, and/or the like. The computer system includes a main structure 110 which may be a computer motherboard, circuit board or printed circuit board, a desktop computer enclosure and/or tower, a laptop computer base, a server enclosure, part of a mobile device, personal data assistant (PDA), or the like. In one embodiment, the main structure 110 includes a graphics card 120. In one embodiment, the graphics card 120 may be a Radeon™ graphics card from Advanced Micro Devices ("AMD") or any other graphics card using memory, in alternate embodiments. The graphics card 120 may, in different embodiments, be connected on a Peripheral Component Interconnect "(PCI") Bus (not shown), PCI-Express Bus (not shown) an Accelerated Graphics Port ("AGP") Bus (also not shown), or any other computer system connection. It should be noted that embodiments of the present application are not limited by the connectivity of the graphics card 120 to the main computer structure 110. In one embodiment, the computer system 100 runs an operating system such as Linux, UNIX, Windows, Mac OS, and/or the like. In one or more embodiments, the computer system 100 may include one or more system registers (not shown) adapted to store values used by the computer system 100 during various operations.

In one embodiment, the graphics card 120 may contain a processing device such as a graphics processing unit (GPU) 125 used in processing graphics data. The GPU 125, in one embodiment, may include one or more embedded memories, such as one or more caches 130. The GPU caches 130 may be L1, L2, higher level, graphics specific/related, instruction, data and/or the like. In various embodiments, the embedded memory(ies) may be an embedded random access memory ("RAM"), an embedded static random access memory ("SRAM"), or an embedded dynamic random access memory ("DRAM"). In alternate embodiments, the embedded memory(ies) may be embedded in the graphics card 120 in addition to, or instead of, being embedded in the GPU 125. In various embodiments the graphics card 120 may be referred to as a circuit board or a printed circuit board or a daughter card or the like.

In one embodiment, the computer system 100 includes a processing device such as a central processing unit ("CPU") 140, which may be connected to a northbridge 145. In various embodiments, the CPU 140 may be a single- or multi-core processor, or may be a combination of one or more CPU cores and a GPU core on a single die/chip (such an AMD Fusion™ APU device). In one embodiment, the CPU 140 may include one or more cache memories 130, such as, but not limited to, L1, L2, level 3 or higher, data, instruction and/or other cache types. In one or more embodiments, the CPU 140 may be a pipe-lined processor. The CPU 140 and northbridge 145 may be housed on the motherboard (not shown) or some other structure of the computer system 100. It is contemplated that in certain embodiments, the graphics card 120 may be coupled to the CPU 140 via the northbridge 145 or some other computer system connection. For example, CPU 140, northbridge 145, GPU 125 may be included in a single package or as part of a single die or "chips" (not shown). Alternative embodiments which alter the arrangement of various components illustrated as forming part of main structure 110 are also contemplated. In certain embodiments, the northbridge 145 may be coupled to a system RAM (or DRAM) 155; in other embodiments, the system RAM 155 may be coupled directly to the CPU 140. The system RAM 155 may be of any RAM type known in the art and may comprise one or more memory modules; the type of RAM 155 does not limit the embodiments of the present application. For example, the RAM 155 may include one or more DIMMs. As referred to in this description, a memory may be a type of RAM, a cache or any other data storage structure referred to herein. In one embodiment, the northbridge 145 may be connected to a southbridge 150. In other embodiments, the northbridge 145 and southbridge 150 may be on the same chip in the computer system 100, or the northbridge 145 and southbridge 150 may be on different chips. In one embodiment, the southbridge 150 may have one or more I/O interfaces 131, in addition to any other I/O interfaces 131 elsewhere in the computer system 100. In various embodiments, the southbridge 150 may be connected to one or more data storage units 160 using a data connection or bus 199. The data storage units 160 may be hard drives, solid state drives, magnetic tape, or any other writable media used for storing data. In one embodiment, one or more of the data storage units may be USB storage units and the data connection 199 may be a USB bus/connection. Additionally, the data storage units 160 may contain one or more I/O interfaces 131. In various embodiments, the central processing unit 140, northbridge 145, southbridge 150, graphics processing unit 125, DRAM 155 and/or embedded RAM may be a computer chip or a silicon-based computer chip, or may be part of a computer chip or a silicon-based computer chip. In one or more embodiments, the various components of the computer system 100 may be operatively, electrically and/or physically connected or linked with a bus 195 or more than one bus 195.

In one or more embodiments, the computer system 100 may include a basic input/output system (BIOS) and/or unified extensible firmware interface (UEFI) 135. In one embodiment, the BIOS/UEFI may include a read-only memory (ROM) and/or one or more caches 130 as described above. For example, the BIOS/UEFI 135 may include an L1 cache and an L2 cache in some embodiments. The BIOS/UEFI 135 may comprise a silicon die/chip and include software, hardware or firmware components. In different embodiments, the BIOS/UEFI 135 may be packaged in any silicon die package or electronic component package as would be known to a person of ordinary skill in the art having the benefit of this disclosure. In alternate embodiments, the BIOS/UEFI 135 may be programmed into an existing computer component. In one embodiment, the BIOS/UEFI may reside on the motherboard 110 and be communicatively coupled to the CPU 140 via connection 196, as shown in FIG. 1. The BIOS/UEFI 135 may include a CPU interface associated with the connection 196. The BIOS/UEFI 135 may be adapted to execute a DDR Vref training algorithm and/or state machine within the CPU 140, in one or more embodiments and as discussed in further detail below. As used herein, the term BIOS/UEFI (e.g., the BIOS/UEFI 135) may be used to refer the physical BIOS/UEFI chip, to circuitry on the BIOS/UEFI 135 chip, or to the functionality implemented by the BIOS/UEFI. In accordance with one or more embodiments, the BIOS/UEFI may function as, and/or be referred to as, a processing device. In some embodiments, some combination of the GPU 125, the CPU 140, the BIOS/UEFI 135 and/or any hardware/software units respectively associated therewith, may collectively function as, and/or be collectively referred to as, a processing device. For example, in one embodiment, the CPU 140, the BIOS/UEFI 135 and their respective caches 130 and interconnects may function as a processing device.

In different embodiments, the computer system 100 may be connected to one or more display units 170, input devices 180, output devices 185 and/or other peripheral devices 190. It is contemplated that in various embodiments, these elements may be internal or external to the computer system 100, and may be wired or wirelessly connected, without affecting the scope of the embodiments of the present application. The display units 170 may be internal or external monitors, television screens, handheld device displays, and the like. The input devices 180 may be any one of a keyboard, mouse, track-ball, stylus, mouse pad, mouse button, joystick, scanner or the like. The output devices 185 may be any one of a monitor, printer, plotter, copier or other output device. The peripheral devices 190 may be any other device which can be coupled to a computer: a CD/DVD drive capable of reading and/or writing to corresponding physical digital media, a universal serial bus ("USB") device, Zip Drive, external floppy drive, external hard drive, phone and/or broadband modem, router/gateway, access point and/or the like. The input, output, display and peripheral devices/units described herein may have USB connections in some embodiments. To the extent certain exemplary aspects of the computer system 100 are not described herein, such exemplary aspects may or may not be included in various embodiments without limiting the spirit and scope of the embodiments of the present application as would be understood by one of skill in the art.

Turning now to FIG. 2, a block diagram of an exemplary BIOS/UEFI 135, in accordance with an embodiment of the present application, is illustrated. In one embodiment, the BIOS/UEFI 135 may contain one or more cache memories 130. The BIOS/UEFI 135, in one embodiment, may include L1, L2 or other level cache memories 130. In one embodiment, the BIOS/UEFI 135 may be adapted to execute a state machine and/or an algorithm in the CPU 140 to perform one or more types of DDR training (e.g., DDR Vref training) The one or more cache memories 130, such as those that may be included in the BIOS/UEFI 135 for example, may be adapted to store and/or facilitate execution of the training state machine and/or algorithm(s). To the extent certain exemplary aspects of the BIOS/UEFI 135 and/or one or more cache memories 130 are not described herein, such exemplary aspects may or may not be included in various embodiments without limiting the spirit and scope of the embodiments of the present application as would be understood by one of skill in the art.

Turning now to FIG. 3A, in one embodiment, the BIOS/UEFI 135 and the cache(s) 130 may reside on a silicon chips/die 340 and/or in the computer system 100 components such as those depicted in FIG. 1. The silicon chip(s) 340 may be housed on the motherboard (e.g., 110) or other structure of the computer system 100. In one or more embodiments, there may be more than one BIOS/UEFI 135 and/or cache memory 130 on each silicon chip/die 340. As discussed above, various embodiments of the BIOS/UEFI 135 may be used in a wide variety of electronic devices.

Turning now to FIG. 3B in accordance with one embodiment, and as described above, one or more of the BIOS/UEFI 135 may be included on the silicon die/chips 340 (or computer chip). The silicon die/chips 340 may contain one or more different configurations of the BIOS/UEFI 135 (e.g., a BIOS/UEFI 135 configured to perform according to one or more operating systems, as noted above). The silicon chips 340 may be produced on a silicon wafer 330 in a fabrication facility (or "fab") 390. That is, the silicon wafers 330 and the silicon die/chips 340 may be referred to as the output, or product of, the fab 390. The silicon die/chips 340 may be used in electronic devices, such as those described above in this disclosure.

Turning now to FIG. 4, a graphical diagram of an exemplary DDR memory cycle byte lane data eye 400 that may be used in conjunction with DDR Vref training in one or more embodiments, is shown. The DDR memory cycle data eye 400 may include a nominal Vref voltage 415 and a central sample time 420. For a given DDR memory cycle, a number of combinations for Vref voltages (y-axis) and data strobe timings (x-axis) may be possible. As shown in FIG. 4, for example, twenty-six different Vref voltage steps may be applied to thirty-two different data strobe times. The number of Vref voltage steps and data strobe times may be determined by a designer, a tester or may otherwise be implementation specific, and may be any number of steps and/or times, as would be apparent to a person of ordinary skill in the art having the benefit of this disclosure. As shown in FIG. 4, the combinations of Vref voltage and data strobe time in dark gray 430 may indicate that such a combination did not result in a successful memory cycle, while the combinations of Vref voltage and data strobe time shown in white 440 may indicate a successful memory cycle at such a combination. In one or more embodiments, some or all of the bit lanes within a byte lane may pass or fail. In one or more embodiments, a plurality of memory cycles may be run for each combination of Vref voltage and data strobe time. In such embodiments, combinations that result in all successful cycles may be denoted as passing while combinations that result in one or more unsuccessful cycles may be denoted as non-passing. As such, the passing combinations may be stored as "1's" in a memory, such as a processor 140 cache 130 and/or a BIOS/UEFI 135 cache 130. In one embodiment, the non-passing combinations may be graded according to the percentage of passing cycles or some other measure, rather than simply "all successful" or "not all successful". In one embodiment, each combination may be graded by the number of bit lanes passing or failing a given cycle. In one embodiment, a bit error rate for protocols with a retry option (e.g. GDDR5), may be determined at each combination of Vref voltage and data strobe time.

Still referring to FIG. 4, a convolution diamond 450 is shown, according to one embodiment. The convolution diamond 450 may be used, in one or more embodiments, to determine a figure of merit (FOM) for a byte lane, rank, channel or the like, for example. The height and width of the convolution diamond 450 may be determined by a designer, by system factors and/or the like. The diamond-shape of the convolution diamond 450 and its width may ensure an adequate timing margin for irregularly shaped data eyes 400. The FOM is a number embodied by the sum of the number of successful combinations inside the convolution diamond 450. The FOM may describe the quality of the data eye for a given Vref and a given data strobe time at the center of the convolution diamond 450. Thus a higher FOM may mean a more robust data eye for memory cycles. A convolution overlay 475 may, in some embodiments, represent a normalized plot of the of the FOM values as the convolution diamond 450 is swept across the combinations of Vref voltage and data strobe time. In other words, the top most plateau or peak of the convolution overlay 475 may indicate the points at which the most robust portion of the data eye 400 exists. In one or more embodiments the convolution overlay 475 may be conceptualized as a 3-D surface (not shown) by moving the convolution point around the data eye 400 at each combination of time/voltage. In one embodiment, time may be the x-axis, voltage may be the y-axis, and the FOM may be the z-axis. In such embodiments, the highest point on the surface with respect to the z-axis may be the most robust and/or optimal.

For example, the data eye 400 of FIG. 4 could be, as in prior art embodiments, trained only in the time domain such that the data strobe would be trained to be centered on the central sample time 420. In contrast, the embodiments described herein allow for the convolution diamond 450 to be shifted left or right within the data eye 400. As previously described, the diamond shape of the convolution diamond 450 may ensure that adequate timing margin is maintained even though the convolution diamond 450 may be shifted to the left or right within the data eye 400. The left or right shifting may also allow for the data strobe to be set at a point that has a higher Vref margin. As illustrated in FIG. 4, if the convolution diamond 450 were to be centered on the central sample time 420, the maximum voltage margin could not be obtained because at the central sample time 420, there are memory cycle failures at the highest voltage values. In accordance with the embodiments herein, however, the convolution diamond 450 may be shifted to the right of the central sample time 420 to a point where the maximum Vref margin (i.e., the full scale of the voltage on the y-axis) may be obtained for the exemplary memory cycles depicted in FIG. 4. As such, the two-dimensional analysis (i.e., voltage vs. time) allows training in both the time domain and the voltage domain. That is, a trade off may be made by moving the data strobe timing away from the center of the sample in order to allow for a greater Vref voltage margin. In one or more embodiments, a number of different nominal Vref values may be used in different iterations of a Vref training. For example, the exemplary Vref training described above may include performing the above described two-dimensional analysis with a first Vref value, then performing the analysis a second time using a second Vref value. Similarly, the Vref training described above may include performing the three-dimensional analysis (discussed above) with a first Vref value, then performing the analysis a second time using a second Vref value.

One data eye 400 is shown in FIG. 4 for the sake of clarity and ease of illustration, however, it is contemplated that multiple analyses of any number of data eyes may be done during a Vref training for any number of lanes, ranks and/or channels in a given system (e.g., the computer system 100) in accordance with the embodiments described herein. For example, in one embodiment the data eye 400 shown in FIG. 4 may represent a byte lane (e.g., bits [7:0]) on a 64-bit data bus. In such a case, seven other data eyes 400 representing the seven remaining byte lanes (i.e., bits [63:56], [55:48], [47:40], [39:32], [31:24], [23:16] and [15:8], respectively) may be analyzed.

Figure 4A:
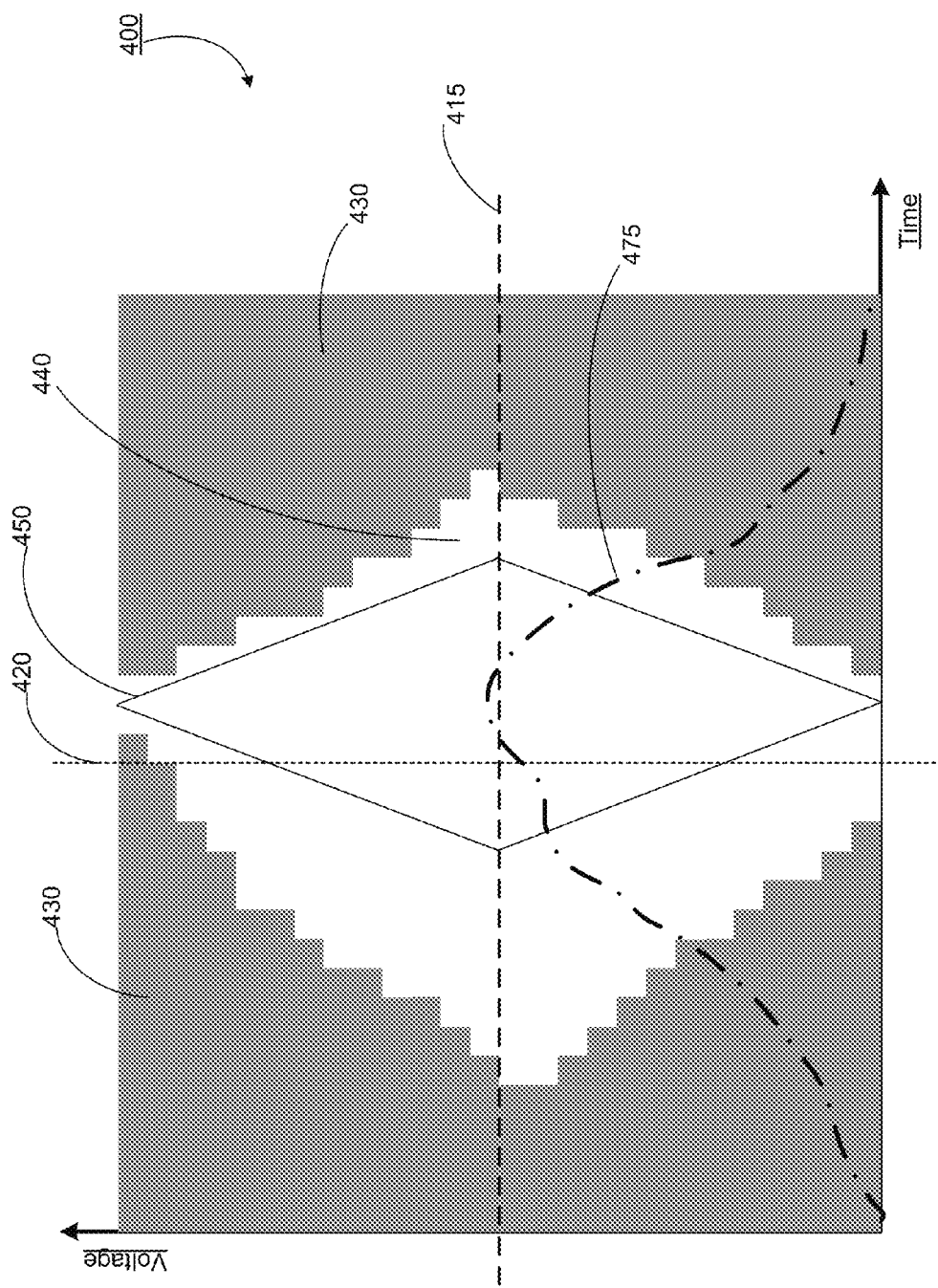
FIG. 4A illustrates a graphical representation of a data eye for a memory cycle used in conjunction with DDR memory training, according to one embodiment.
Figure 4B:
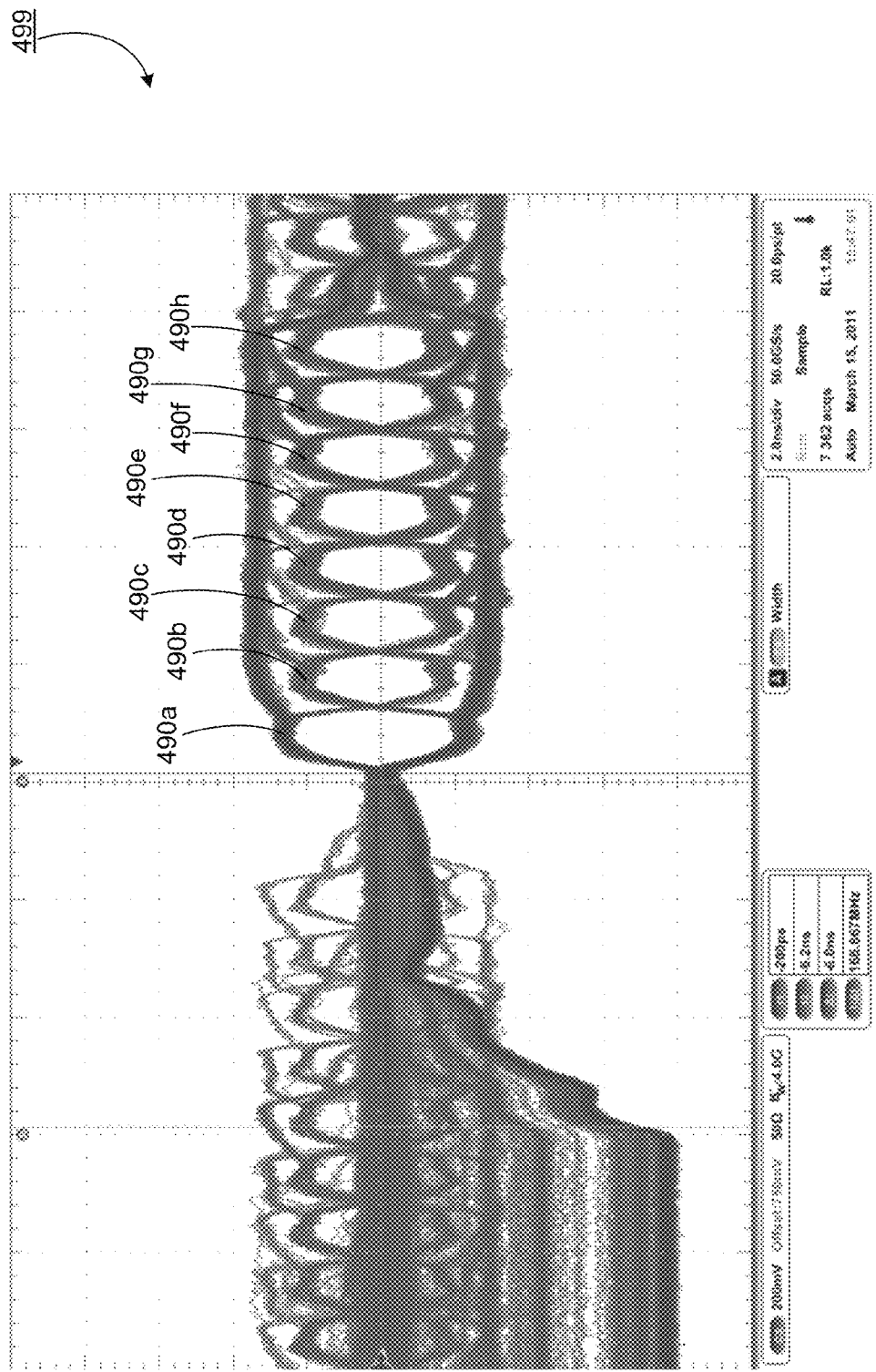
FIG. 4B illustrates a signal representation of the data bus graphically depicted in FIG. 4A, according to one embodiment.

Turning now to FIG. 4B, a bus signal representation corresponding the data eye 400 graphically depicted in FIG. 4A is shown, according to one embodiment. The exemplary data bus signal 499 depicted in FIG. 4B shows a plurality of data eyes 490a-h. In one embodiment, each of the data eyes 490*a-h* may respectively correspond to a bit time associated with the data bus signal 499. In the example shown in FIG. 4B, eight data eyes 490*a-h* are shown corresponding to eight bits (one byte) of the data bus signal 499 on a data bus (e.g., a DDR memory data bus). Each of the eight data eyes 490*a-h* may represent one or more data cycles run, for the corresponding eight bits shown, over a period of time. In one embodiment, more than 1000 memory cycles may be run to produce the data bus signal 499 as depicted in FIG. 4B. In one embodiment, the eight bits corresponding to the data eyes 490*a-h* may comprise a byte lane of a memory bus. The data eyes 490*a-h* may be aggregated to form a byte lane data eye (e.g., data eye 400) upon which DDR timing and Vref training may be performed. In alternate embodiments, DDR training for timing and Vref values may be performed on a per-bit, per-rank, per-channel or per-bus basis, or may be performed using any other data bit organization determined by a designer, developer and/or tester.

Figure 5:
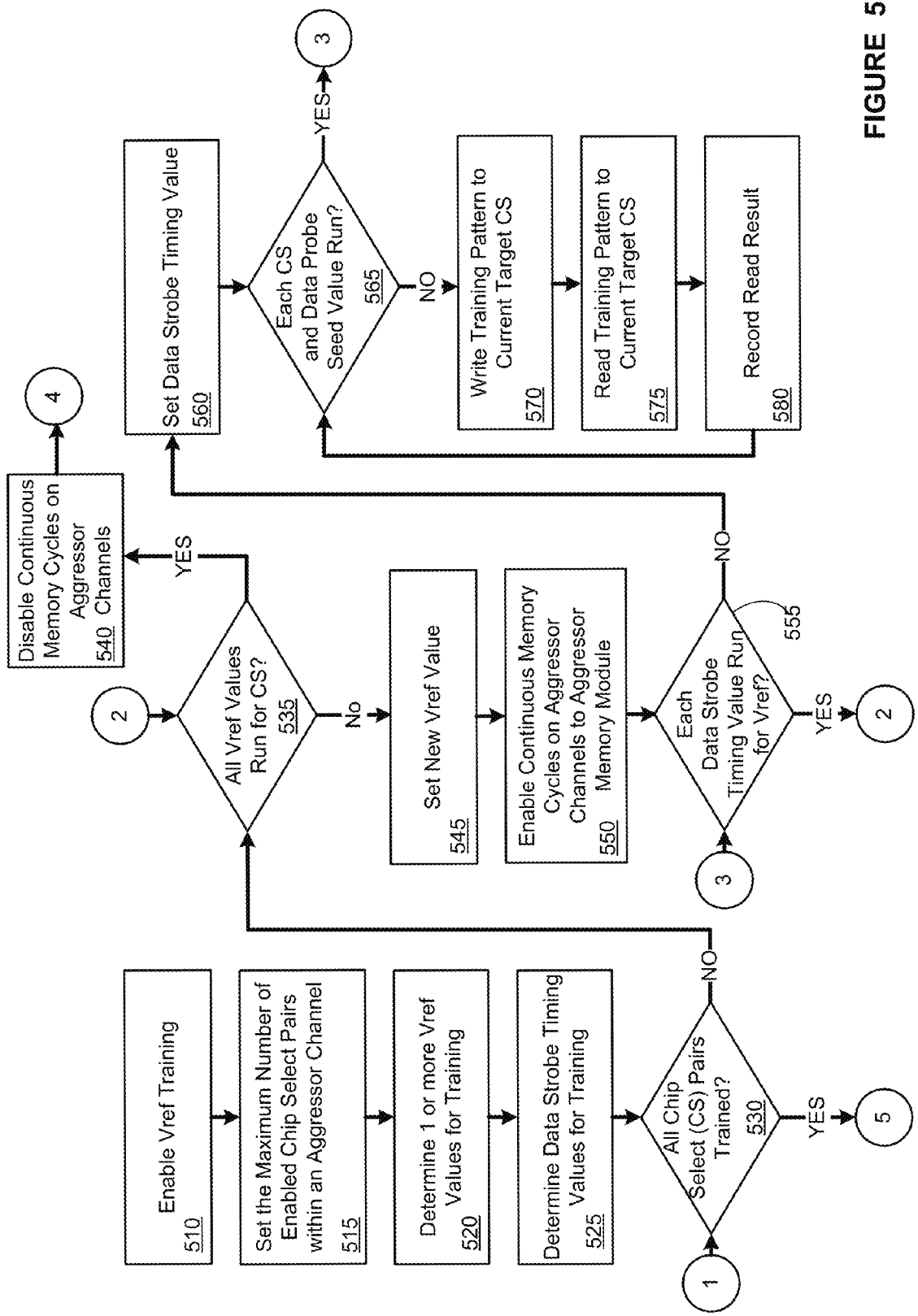
FIG. 5 illustrates a flowchart depicting DDR memory training, according to one embodiment.

Turning now to FIG. 5, an exemplary flowchart depicting one or more embodiments of a DDR memory Vref training is shown. At 510, Vref training may be enabled. In one embodiment, Vref training may be enabled by writing to a system register. As described herein, when a value is "set" or "determined," the value may be written to a system register. At 515, the maximum number of enabled chip select pairs within an aggressor channel may be set. In other words, this is the maximum number of chip select pairs that may be written to during the training of the victim channel. At 520, one or more Vref values may be determined for use during training. In one embodiment, a number of steps up and/or down from a nominal Vref voltage value (e.g., 415) may be determined. These steps may be determined in terms of a percentage of the nominal Vref voltage or these steps may be voltage increments such as, but not limited to, 0.01V, 0.05V, 0.1V, etc. As such, the nominal Vref and the determined voltage steps may comprise the one or more Vref values to be used during training. At 525, one or more data strobe timing values may be determined for training. For read training, a read data strobe timing value may be determined. Similarly, for a write training, a write data strobe timing value or a write data timing value may be determined. In one embodiment, a number of steps left and/or right from a central sample time (e.g., 420) may be determined. These steps may be determined in terms of a percentage of the central sample time or these steps may be increments of time such as, but not limited to, a fraction of the data strobe time period for a given data strobe frequency and/or the like. As such, the central sample time and the determined time steps may comprise the one or more data strobe timing values to be used during training.

In one or more embodiments, the Vref and data strobe timing values may be selected to be a subset of the total number of possible Vref/timing combinations. For example, the combination of the nominal Vref and central timing value may be the first cycle run, as it may be most likely to be a passing cycle. Then the Vref value may be incremented and/or decremented until a failing cycle is determined. The training may then continue around the "rim" of the data eye, e.g., the data eye 400 (determined the boundary of passing and failing cycles) until the passing boundary of the data eye is determined. The interior (e.g., 440) of the data eye may then be interpolated upon which a convolution may be performed. In alternate embodiments, other partial- or sub-sampling techniques may be used. For example, if training begins at the nominal Vref and central timing value, Vref values above the first failing Vref value greater than nominal and Vref values below the first failing Vref value less than nominal may not be trained. Similarly, timing values to the right of the first failing timing value greater than central value and timing values to the left of the first failing timing value less than central value may not be trained. In other embodiments, lower sampling rates for Vref and/or timing values may be used. In alternate embodiments, sub-sampling techniques based upon the Vref and/or timing values may be used.

It is noted that for DDR memory training, the host controller (for example, in the CPU 140) may have an increased complexity for adding configurable delay elements for signal timing over the DRAM (e.g., DRAM 155). This may be due to the nature of cycle issuance and the nature of memory cycles themselves. That is, cycles sent from DRAM to a host, such as data read cycles, may have fixed timing delays and/or relationships (i.e., tightly matched timing) between the data and the data strobe cycle components. In one embodiment, the DRAM-side signals may have one or more programmable aspects for memory cycles. For example, the read data and/or the read data strobe signals may include a programmable delay such that the read data may be shifted in time relative to the read data strobe, or the read data strobe may be shifted in time relative to the read data. In some embodiments, write data and write data strobe signals could be similarly programmed.

Still referring to FIG. 5, from 525, the flow may proceed to 530 where it may be determined if all chip select pairs in the system (e.g., computer system 100) have been trained. If all chip select pairs have been trained and the determination is "YES", the flow may proceed to 650 described below with respect to FIG. 6. If the DDR training is just beginning, or the determination is "NO," the flow may proceed to 535 where a determination may be made if memory cycles have been run for all Vref values determined in 520. If memory cycles have been run for all the determined Vref values ("YES"), the flow may proceed to 540 where the aggressor channel memory cycles may be disabled, and then to 610 described below with respect to FIG. 6. If the determination is "NO", the flow may proceed to 545 where a Vref value may be set at which to run memory cycles. If no previous Vref values have been set, the first determined Vref value (from 520) is set; if a previous Vref value has been set, the next determined Vref value (from 520) is set. At 550, continuous memory cycles on the aggressor channels to the aggressor memory modules are enabled. In other words, in one or more embodiments, while the victim channel is being trained, the aggressor channels will have memory cycles run upon them continuously.

From 550, the flow may proceed to 555 where it may be determined if memory cycles for each determined data strobe timing value (from 525) have been run for the currently selected/set Vref (from 545). If the determination is "YES", the flow may proceed to 535. If the determination is "NO", the flow may proceed to 560 where a data strobe timing value may be set at which to run memory cycles. If no previous data strobe timing values have been set, the first determined data strobe timing value (from 525) is set; if a previous data strobe timing value has been set, the next determined data strobe timing value (from 525) is set. From 560, the flow may proceed to 565 where a determination is made if memory cycles have been run to each chip select for the target victim memory module using one or more data probe seed values. In one embodiment, any remaining data probe seed iterations may be skipped if all data lanes fail at a given Vref/timing setting for a previous iteration. If the determination is "YES", the flow may proceed to 555. If the determination is "NO", the flow may proceed to 570 where a training pattern based upon the current seed is written to the current target chip select. In one embodiment, the BIOS/UEFI 135 or a hardware state machine may determine the training pattern used. In other embodiments, a memory controller may generate the training patterns. At 575, the written training pattern from 570 is read from the current target chip select. At 580, the result of the read may be recorded or stored in the system. In one embodiment, the result may be recorded in a cache 130 of a processor 140 or a BIOS/UEFI 135, or the result may be stored in one or more system registers (not shown). The result may be indicative of the passing or failing of the memory cycle (e.g., stored as a 1 ("one") or a 0 ("zero") respectively, or vice versa), or the result may be indicative of a bit error rate, a percentage of passing cycles and/or the like. In various embodiments, the results may be stored for bit lanes, nibble lanes or byte lanes. From 580, the flow may return to 565.

Figure 6:
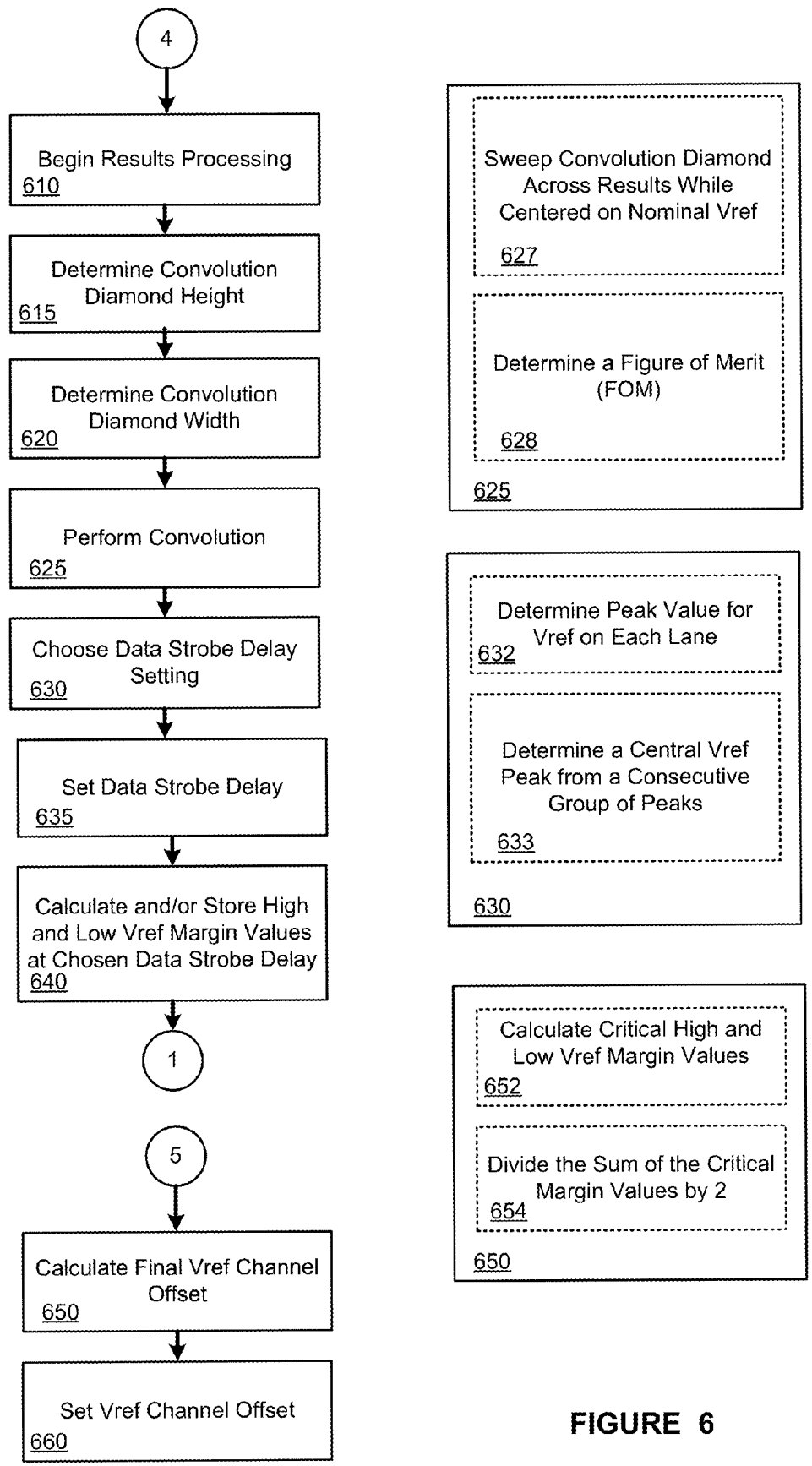
FIG. 6 illustrates a flowchart depicting DDR memory training, according to one exemplary embodiment.

Turning now to FIG. 6, an exemplary flowchart depicting one or more embodiments of a DDR memory Vref training is shown. In one embodiment, the flowchart depicted in FIG. 6 may be a continuation of the DDR memory training shown in, and described above with respect to, FIG. 5. At 610, the flow may proceed from 540 where processing of the memory cycles may begin. At 615, a height of a convolution diamond (e.g., 450) may be determined. In one embodiment, the height may be ±20% of the nominal Vref value (e.g., 415), but other appropriate heights, such as, but not limited to, other percentages of the nominal Vref value or a number of voltage increments, may be used. At 620, the width of the convolution diamond may be determined. In one embodiment, the width may be determined according to a relationship with the DDR memory rate. For example, a rate of 667 MHz or 800 MHz may give a width of 6 data strobe timing steps, a rate of 1066 MHz may give a width of 7 steps, a rate of 1333 MHz may give a width of 8 steps, a width of 1600 MHz may give a width of 9 steps and a rate of 1866 MHz may give a width of 10 steps. The diamond widths described here are exemplary in nature, and other diamonds widths are contemplated according to design and usage factors/constraints. It is contemplated that, in some embodiments, convolution shapes are not limited to a diamond (e.g., the convolution diamond 450), but could be convolution ellipses, circles, squares, n-sided polygons, or other shapes. It is also contemplated that the convolution shapes need not be symmetric (e.g., the shapes could be biased in the positive or negative x- and/or y-axes depending upon the data eye (e.g., data eye 400).

At 625, a convolution may be performed using the convolution diamond. In one embodiment, the convolution diamond may be swept across, for example, the equivalent of a graphical representation of the stored results from 580. It is contemplated that the convolution diamond may be swept from left to right or from right to left. According to one embodiment, the convolution diamond is swept along with its widest width at the nominal Vref value (e.g., 415), as in 627. In one embodiment, a figure of merit (FOM) may be determined (at 628) for each data strobe timing step by summing the number of passing voltage-timing combinations within the convolution diamond. The FOM values may be normalized and may thus graphically indicate as a curve (e.g., 475) which data strobe timing steps are the most robust. That is, the maximum peaks (or the maximum plateau(s)) of the FOM curve may indicate that the corresponding data strobe timing step provides a robust combination of Vref margin and data strobe timing margin. At 630, a data strobe delay setting (i.e., a particular step) may be chosen. In one embodiment, choosing the data strobe delay may include determining the data strobe delay corresponding to a peak Vref value at the data strobe timing step (delay value) on each bit-, nibble-, or byte-lane. If multiple peaks exist, the central peak of a group of consecutive peaks may be chosen in accordance with one embodiment. In other embodiments, the data strobe delay setting may be the step with a Vref peak where the step is the furthest away from the first failing voltage/strobe time combination. At 635 the data strobe delay may be set. At 640, the high and low Vref margin values (i.e., the Vref margin above and below the nominal Vref value) at the chosen data strobe delay may be calculated and/or stored. From 640, the flow may proceed to 530.

Referring momentarily back to FIG. 5, at 530 the flow may proceed to 650 if it is determined that all chip select pairs for all channels have been trained. Turning back to FIG. 6, at 650, a final Vref offset value for a channel or lane (bit-, nibble-, byte- and/or the like) may be calculated and/or determined. In one embodiment, the critical high and low Vref margin values may be calculated at 652. The critical high margin value may be the largest mutual Vref passing point across all memory modules of the channel or lane, in accordance with one embodiment. The critical low margin value may be the smallest mutual Vref passing point across all memory modules of the channel or lane. For example, a DDR memory Vref training including three DIMMs (e.g., DIMM0, DIMM2 and DIMM4) may have the following critical margins: DIMM0+11%/−12%; DIMM2+9%/−12%; DIMM4+10%/−7%. In such a case, the largest mutual passing point for the high margin would be +9%, and the smallest mutual passing point for the low margin would be −7%. To obtain the final Vref value, the high and low values are summed (e.g., 9+−7=2) and the result is divided by 2 (e.g., 2÷2=1). Thus the final Vref value for this example is 1%. At 660, the final Vref offset of the channel or lane is set.

An exemplary advantage of the DDR memory training being carried out in the voltage domain is that the operating frequency of the DDR memory may be increased at least because the Vref margins determined during training may be maximized with respect to data strobe timing. In other words, by performing training in two dimensions (e.g., time and voltage) it may be determined that a computer system with a given hardware configuration may by optimized such that its maximized Vref margins allow the system's DDR memory to operate at a high frequency while still maintaining stability and robust operation. Additionally, a computer system's DDR memory may also operate at a lower frequency with increased robustness. By performing DDR memory Vref training at boot time, a computer system may be configured to operate at a lower power, for example, by taking advantage of maximized Vref margins.

It is contemplated that the elements as shown in FIG. 5 and/or 6 are not limited to the order in which they are described above. In accordance with one or more embodiments, the elements shown in FIG. 5 and/or 6 may be performed sequentially, in parallel, or in alternate order(s) without departing from the spirit and scope of the embodiments presented herein. For example, it is contemplated that the embodiments of DDR training described herein may include performing training on two or more data lanes in parallel. It is also contemplated that the flowcharts may be performed in whole, or in part(s), in accordance with one or more embodiments presented herein. That is, the flowcharts shown in the Figures need not perform every element described in one or more embodiments.

It is also contemplated that, in some embodiments, different kinds of hardware descriptive languages (HDL) may be used in the process of designing and manufacturing very large scale integration circuits (VLSI circuits) such as semiconductor products and devices and/or other types semiconductor devices. Some examples of HDL are VHDL and Verilog/Verilog-XL, but other HDL formats not listed may be used. In one embodiment, the HDL code (e.g., register transfer level (RTL) code/data) may be used to generate GDS data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., data storage units 160, RAMs 155 (including embedded RAMs, SRAMs and/or DRAMs), compact discs, DVDs, solid state storage and/or the like). In one embodiment, the GDSII data (or other similar data) may be adapted to configure a manufacturing facility (e.g., through the use of mask works) to create devices capable of embodying various aspects described herein, in the instant application. In other words, in various embodiments, this GDSII data (or other similar data) may be programmed into a computer 100, processor 125/140 or controller, which may then control, in whole or part, the operation of a semiconductor manufacturing facility (or fab) to create semiconductor products and devices. For example, in one embodiment, silicon wafers containing one or more BIOS/UEFI 135, hardware state machines and/or algorithms (not shown), caches 130, and/or the like may be created using the GDSII data (or other similar data).

It should also be noted that while various embodiments may be described in terms of BIOS and/or UEFI, it is contemplated that the embodiments described herein may have a wide range of applicability, for example, in systems that include DDR memory in general (e.g., DDR2/DDR3), as would be apparent to one of skill in the art having the benefit of this disclosure. For example, the embodiments described herein may be used in systems that implement DDR memory voltage reference training using a specific hardware circuit and/or state machines in addition to, or alternatively to, BIOS/UEFI implementations. Similarly, systems that perform signaling using voltage reference signals in addition to, or alternatively to, DDR memory signaling are contemplated as being within the scope of the embodiments described herein.

The particular embodiments disclosed above are illustrative only, as the embodiments herein may be modified and practiced in different but equivalent manners apparent to those skilled in the art having the benefit of the teachings herein. Furthermore, no limitations are intended to the details of construction or design as shown herein, other than as described in the claims below. It is therefore evident that the particular embodiments disclosed above may be altered or modified and all such variations are considered within the scope of the claimed invention.

Accordingly, the protection sought herein is as set forth in the claims below.

What is claimed:

1. A method, comprising:
   performing at least one memory operation in response to at least one instruction indicative of performing a double data rate (DDR) memory reference voltage training in the voltage domain by a processing device; and
   determining a DDR memory reference voltage and a DDR memory delay time based at least upon the performed at least one memory operation.

2. The method of claim 1, further comprising:
   storing at least one separate value associated with each respective at least one memory operation; and
   wherein determining the DDR memory reference voltage is based at least upon the stored value.

3. The method of claim 2, wherein performing the at least one memory operation comprises performing a plurality of memory operations at a nominal reference voltage;
   wherein determining the DDR memory reference voltage comprises:
      performing a convolution function analysis on the at least one separate value associated with each respective operation of the plurality of memory operations;
      determining a figure of merit (FOM) based at least upon the performed convolution function analysis; and
      determining the DDR memory reference voltage based at least upon the FOM.

4. The method of claim 3, wherein performing a plurality of memory operations comprises at least one of:
   performing at least one memory operation on a plurality of memory channels; or
   performing at least one memory operation on a plurality of memory channels concurrently.

5. The method of claim 3, wherein determining the DDR memory reference voltage further comprises at least one of:
   determining a single reference voltage for a plurality of DDR memory byte lanes; or
   determining a reference voltage or each DDR memory byte lane.

6. The method of claim 3, further comprising adjusting a DDR memory data rate based at least upon the DDR memory reference voltage.

7. The method of claim 1, wherein the received at least one instruction is indicative of performing a DDR reference voltage training in the time domain.

8. The method of claim 1, wherein the at least one memory operation is at least one of a memory read operation or a memory write operation.

9. The method of claim 1, wherein the at least one instruction is received from at least one of a basic input/output system (BIOS) or a unified extensible firmware interface (UEFI).

10. The method of claim 1, wherein the at least one instruction is received from a hardware state machine.

11. A non-transitory, computer-readable storage device encoded with data that, when executed by a processing device, adapts the processing device to perform a method, comprising:
    performing at least one memory operation in response to at least one instruction indicative of performing a double data rate (DDR) memory reference voltage training in the voltage domain by a processing device; and
    determining a DDR memory reference voltage and a DDR memory delay time based at least upon the performed at least one memory operation.

12. The non-transitory, computer-readable storage device encoded with data that, when executed by a processing device, adapts the processing device to perform a method as in claim 11, further comprising:
    storing at least one separate value associated with each respective at least one memory operation; and
    wherein determining the DDR memory reference voltage is based at least upon the stored value.

13. The non-transitory, computer-readable storage device encoded with data that, when executed by a processing device, adapts the processing device to perform a method as in claim 12, wherein performing the at least one memory operation comprises performing a plurality of memory operations at a nominal reference voltage;
    wherein determining the DDR memory reference voltage comprises:

performing a convolution function analysis on the at least one separate value associated with each respective operation of the plurality of memory operations;
determining a figure of merit (FOM) based at least upon the performed convolution function analysis; and
determining the DDR memory reference voltage based at least upon the FOM.

14. The non-transitory, computer-readable storage device encoded with data that, when executed by a processing device, adapts the processing device to perform a method as in claim 13, wherein performing a plurality of memory operations comprises at least one of:
performing at least one memory operation on a plurality of memory channels; or
performing at least one memory operation on a plurality of memory channels concurrently; and
wherein determining the DDR memory reference voltage further comprises at least one of:
determining a single reference voltage for a plurality of DDR memory byte lanes; or
determining a reference voltage or each DDR memory byte lane.

15. The non-transitory, computer-readable storage device encoded with data that, when executed by a processing device, adapts the processing device to perform a method as in claim 13, further comprising adjusting a DDR memory data rate based at least upon the DDR memory reference voltage.

16. The non-transitory, computer-readable storage device encoded with data that, when executed by a processing device, adapts the processing device to perform a method as in claim 11, wherein the received at least one instruction is indicative of performing a DDR reference voltage training in the time domain.

17. The non-transitory, computer-readable storage device encoded with data that, when executed by a processing device, adapts the processing device to perform a method as in claim 11, wherein the at least one memory operation is at least one of a memory read operation or a memory write operation.

18. The non-transitory, computer-readable storage device encoded with data that, when executed by a processing device, adapts the processing device to perform a method as in claim 11, wherein the at least one received instruction is received from at least one of a basic input/output system (BIOS) or a unified extensible firmware interface (UEFI).

19. The non-transitory, computer-readable storage device encoded with data that, when executed by a processing device, adapts the processing device to perform a method as in claim 11, wherein the at least one received instruction is received from a hardware state machine.

20. A circuit that comprises:
at least one communication interface portion configured to be communicatively coupled to at least one memory portion and to a processing device; and
a circuit portion, communicatively coupled to the at least one communication interface portion, that comprises at least one of a hardware state machine, or an algorithm, adapted to provide instructions to the processing device to perform a double data rate (DDR) reference voltage training at least in the voltage domain.

21. The circuit of claim 20, wherein the circuit portion is configured to transmit, using the at least one communication interface, at least one separate value associated with a respective at least one memory operation to the at least one memory portion; and
wherein determining the DDR memory reference voltage is based at least upon the transmitted at least one separate value.

22. The circuit of claim 21, wherein the circuit portion is configured to:
perform the at least one memory operation by performing a plurality of memory operations at a nominal reference voltage; and
determine the DDR memory reference voltage by:
performing a convolution function analysis on the at least one separate value associated with each respective at least one memory operation;
determining a figure of merit (FOM) based at least upon the performed convolution function analysis; and
determining the DDR memory reference voltage based at least upon the FOM.

23. The circuit of claim 22, wherein the circuit portion is configured to adjust a DDR memory data rate based at least upon the DDR memory reference voltage.

* * * * *